United States Patent
Chen et al.

(10) Patent No.: US 9,716,513 B1
(45) Date of Patent: Jul. 25, 2017

(54) SYSTEMS AND METHODS FOR GENERATING A COMMON MODE COMPENSATION VOLTAGE IN A SAR ADC

(71) Applicant: Analog Devices, Inc., Norwood, MA (US)

(72) Inventors: Baozhen Chen, Woburn, MA (US); Mark D. Maddox, Derry, NH (US); Zhichao Tan, Wilmington, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/227,687

(22) Filed: Aug. 3, 2016

(51) Int. Cl.
H03M 1/06 (2006.01)
H03M 1/46 (2006.01)
H03M 1/12 (2006.01)

(52) U.S. Cl.
CPC ......... H03M 1/466 (2013.01); H03M 1/1245 (2013.01)

(58) Field of Classification Search
CPC .... H03M 1/0612; H03M 1/466; H03M 1/201; H03M 1/42; H03M 1/06; H03M 1/1023; H03M 1/203; H03M 1/207; H03M 1/00
USPC .......... 341/144, 172, 161, 118, 155
See application file for complete search history.

(56) References Cited

U.S. PATENT DOCUMENTS

| | | | | |
|---|---|---|---|---|
| 7,705,755 B2* | 4/2010 | Yang | ............... | H03M 1/109 341/118 |
| 7,965,218 B2* | 6/2011 | Ohnhaeuser | ............ | H03M 1/08 341/161 |
| 2011/0032134 A1* | 2/2011 | Cho | ............... | H03M 1/0682 341/144 |

OTHER PUBLICATIONS

Chen, Yanfei, et al., "A 9b 100MS/s 1.46mW SAR ADC in 65nm CMOS", IEEE Asian Solid-State Circuits Conference, (Nov. 18, 2009), 145-148.
Liou, Chang-Yuan, et al., "A 2.4-to-5.2 1J/conversion-step 10b 0.5-to-4MS/s SAR ADC with Charge-Average Switching DAC in 90nm CMOS", ISSCC, Session 15, Data Converter Techniques 15.7, (Feb. 19, 2013), 3 pgs.
Zhu, Yan, et al., "A 10-bit 100-MS/s Reference-Free SAR ADC in 90 nm CMOS", IEEE Journal of Solid-State Circuits, vol. 45, No. 6, (Jun. 2010), 11 pgs.

* cited by examiner

*Primary Examiner* — Jean B Jeanglaude
(74) *Attorney, Agent, or Firm* — Schwegman Lundberg & Woessner, P.A.

(57) ABSTRACT

During operation of a SAR ADC, it is possible to exceed the voltage limits of a comparator by presenting voltages at the comparator input that exceed a limited range of acceptable input voltages. The present disclosure provides a system and method such as for delivering a common mode compensation voltage such that voltages present at the comparator inputs can be within the limited range of acceptable input voltages.

20 Claims, 7 Drawing Sheets

SYSTEMS AND METHODS FOR GENERATING A COMMON MODE COMPENSATION VOLTAGE IN A SAR ADC

FIELD OF THE DISCLOSURE

The present disclosure relates to systems and methods for operating a successive approximation register (SAR) SAR analog-to-digital converter (ADC).

BACKGROUND

Certain successive approximation register (SAR) analog-to-digital converters (ADCs) include a comparator that compares a sampled input voltage to a reference voltage and outputs a digital result during bit trials.

SUMMARY OF THE DISCLOSURE

In a SAR ADC having a low voltage comparator, the voltage at the input of the comparator can exceed allowable levels during bit trials of the ADC. The inventors have recognized, among other things, a need for a SAR ADC that may perform bit trials without exceeding a voltage limit of a comparator included in a SAR ADC.

In certain systems, a common mode voltage can be applied to the bottom plates of the digital-to-analog converters (DACs) in a SAR ADC. The common mode voltage can have a value such as an average value of the applied reference voltages. This approach can lead to a voltage at the input of the comparator that can extend outside the power supply voltage rails of the comparator. This can lead to a loss of charge representing the analog signal being converted and, therefore, degradation of the analog-to-digital conversion process. The inventors have recognized, among other things, that it is possible to provide a common mode voltage having a value such that out of rail voltages at the comparator input can be reduced. The inventors have also recognized that it is possible to provide a common mode voltage to the bottom plates of the DACs in a SAR ADC without the need for an explicit voltage source or an extra pin on a chip. Further features of the disclosure are provided in the appended claims, which features may optionally be combined with each other in any permutation or combination, unless expressly indicated otherwise elsewhere in this document.

In an aspect, the disclosure can feature a method of establishing a common mode voltage, such as in a differential successive approximation register (SAR) converter. The method can include sampling a first and second input voltage, with respect to a top plate common mode voltage, respectively using a first and second digital-to-analog converter (DAC), the first and second DACs each having multiple capacitor elements, each element having a top plate and bottom plate and corresponding to a digital bit position. The method can also include preparing for carrying out bit trials such as by forming an electrical connection from the bottom plate of at least one element in the first DAC to the bottom plate in at least one corresponding digital bit position element in the second DAC, such as to form at least one corresponding common mode voltage having a value of an average of the first and second input voltage. The method can also include then carrying out bit trials using the first and second DAC. The method can also include disconnecting a comparator input from the first and second DAC before the preparing for carrying out bit trials. The method can also include then reconnecting the comparator input to the first and second DAC and carrying out bit trials. The electrical connection formed by the bottom plate of at least one element in the first DAC and the bottom plate in at least one corresponding digital bit position element in the second DAC can be floating.

In an aspect, the disclosure can feature a method of establishing a common mode compensation voltage, such as in a differential successive approximation register (SAR) converter. The method can include sampling a first and second input voltage with respect to a top plate common mode voltage, respectively using a first and second digital-to-analog converter (DAC), the first and second DACs each having multiple capacitor elements, each element having a top plate and bottom plate and corresponding to a digital bit position. The method can also include preparing for carrying out bit trials by coupling the bottom plates of at least one pair of like digital bit position elements in the respective first and second DACs to a common mode compensation voltage that can be based on a difference between an input voltage and a top plate common mode voltage. The method can also includes carrying out the bit trials using the first and second DACs. The common mode compensation voltage can be based on a difference between an input common mode voltage and the top plate common mode voltage. The common mode compensation voltage can based on a difference between an input reference voltage and the top plate common mode voltage. The method can also include sampling the common mode compensation voltage onto a capacitor and coupling the capacitor to the bottom plate of the first and second DACs, such as to provide the common mode compensation voltage to the first and second DACs. The method can also include disconnecting a comparator input from the first and second DAC, such as before the preparing for carrying out bit trials. The method can also include reconnecting a comparator input to the first and second DAC, such as after the preparing for carrying out bit trials, but before the carrying out the bit trials.

In an aspect, the disclosure can feature a system for establishing a common mode voltage, such as in a differential successive approximation register (SAR) converter. The system can include a first digital-to-analog converter (DAC) circuit that can be configured to sample a first input voltage with respect to a top plate common mode voltage, the first DAC circuit having multiple capacitor elements, each element including a top plate and a bottom plate and corresponding to a digital bit position. The system can also include a second DAC circuit that can be configured to sample a second input voltage with respect to the top plate common mode voltage, the second DAC circuit having multiple elements, each element including a top plate and a bottom plate corresponding to a digital bit position. The system can also include control circuitry that can be configured to form an electrical connection from the bottom plate of at least one element in the first DAC circuit to the bottom plate in at least one corresponding digital bit position element in the second DAC circuit before carrying out bit trials, such as to form at least one corresponding common mode voltage, such as having a value of an average of the first and second input voltage. The control circuitry can be further configured to carry out bit trials, such as using the first and second DAC circuit. The control circuitry can be further configured to disconnect a comparator input from the first DAC circuit and the second DAC circuit before forming the electrical connection between the first DAC circuit and the second DAC circuit. The control circuitry can be further configured to then reconnect the comparator input to the first DAC circuit and the second DAC circuit, before carrying out bit trials. The electrical connection formed by the bottom plate of at least one element in the first DAC circuit and the bottom plate in at least one corresponding digital bit position element in the second DAC circuit can be floating.

In an aspect, the disclosure can feature a system, such as for establishing a common mode compensation voltage in a differential successive approximation register (SAR) converter. The system can include a first digital-to-analog converter (DAC) circuit that can be configured to sample a first input voltage with respect to a top plate common mode voltage, the first DAC circuit having multiple capacitor elements, each element having a top plate and bottom plate and corresponding to a digital bit position. The system can also include a second DAC circuit that can be configured to sample a second input voltage with respect to the top plate common mode voltage, the second DAC circuit having multiple elements, each element having a top plate and bottom plate and corresponding to a digital bit position. The system can also include control circuitry that can be configured to couple the bottom plates of at least one pair of like digital bit position elements in the respective first DAC circuit and the second DAC circuit to a common mode compensation voltage that can be based on a difference between an input voltage and the top plate common mode voltage before carrying out bit trials. The control circuitry can be further configured to carry out bit trials using the first and second DAC circuits. The common mode compensation voltage can be based on a difference between an input common mode voltage and the top plate common mode voltage. The common mode compensation voltage can be based on a difference between an input reference voltage and the top plate common mode voltage. The system can also include a capacitor that can be configured to sample a common mode compensation voltage such as to provide the sampled common mode compensation voltage to the first DAC circuit and the second DAC circuit. The control circuitry can be further configured to disconnect a comparator input from the first and second DAC circuits before coupling the bottom plates of the first and second DAC circuits to the common mode compensation voltage. The control circuitry can be further configured to reconnect the comparator input to the first and second DAC circuits, after coupling the bottom plates of the first and second DAC circuits to the common mode compensation voltage, but before carrying out the bit trials.

BRIEF DESCRIPTION OF THE DRAWINGS

The present disclosure will now be described, by way of example, with reference to the accompanying drawings, in which.

DETAILED DESCRIPTION OF EMBODIMENTS OF THE DISCLOSURE

A SAR ADC can convert an analog voltage, such as to provide a digital output. A SAR ADC can include a comparator, such as which can make one or more comparisons between two input voltages and can present an output based on the comparison. The comparator can have a limited range of acceptable input voltages (e.g., the acceptable voltage at the comparator input can be limited to a range between 0V and 5V, or other such voltage limits such as may be defined by the power supplies operating the comparator). During bit trial operation of the SAR ADC, it is possible to exceed the voltage limits of the comparator by presenting voltages at the comparator input that exceed the limited range of acceptable input voltages, such as which can lead to a loss of charge representing the analog signal being converted and, therefore, degradation of the analog-to-digital conversion process. For example, the voltages at the comparator input can exceed the limited range of acceptable input voltages when an input signal common mode voltage is different than the top plate common mode voltage applied to the top plates of the DACs or the comparator input common mode voltage. Described below is a method such as for delivering a common mode compensation voltage such that voltages present at the comparator inputs can be within the limited range of acceptable input voltages.

Figure 1A:
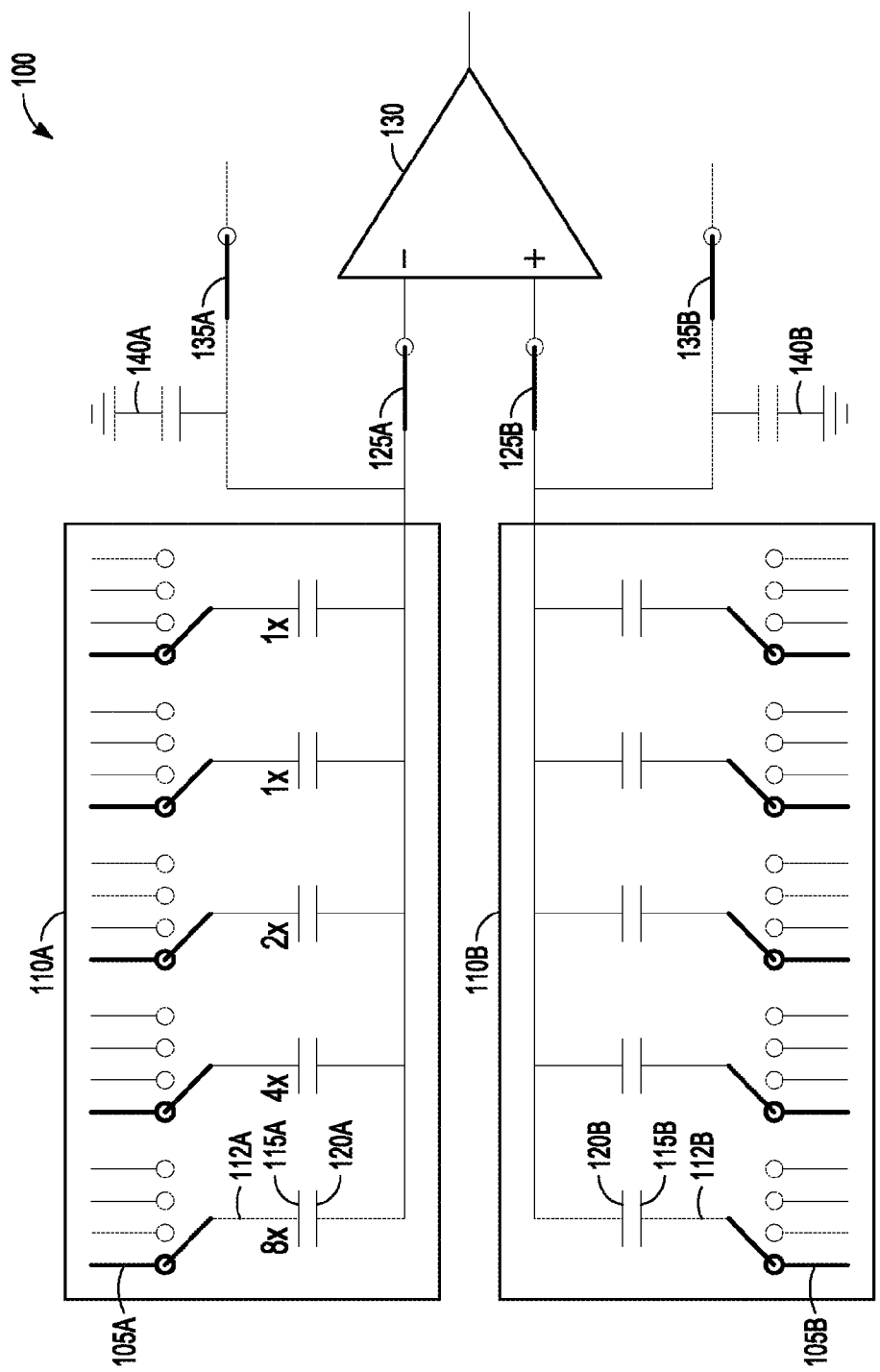
FIGS. 1A and 1B illustrate a diagram of a SAR ADC.

FIG. 1A shows an example of a SAR ADC 100. The SAR ADC 100 can include a first DAC 110a, a second DAC 110b, input sampling switches 105a and 105b, comparator input switches 125a, and 125b, comparator 130, and top plate sampling switches 135a and 135b. The first DAC 110a can include one or more capacitors 112a, and each capacitor 112a can include a top plate 120a and a bottom plate 115a. The capacitors 112a can include one or more parasitic capacitances 140a. The second DAC 110b can include multiple capacitors 112b, and each capacitor 112b can include a top plate 120b and a bottom plate 115b. The capacitors 112b can include one or more parasitic capacitances 140b. The bottom plates 115a and 115b can be connected to the input sampling switches 105a and 105b, respectively. The top plates 120a and 120b can be connected to the top plate sampling switches 135a and 135b, respectively. The top plates 120a and 120b can also be connected to the comparator input switches 125a and 125b, respectively. The inputs of the comparator 130 can generally accept voltages in a range between zero volts and $V_{dd}$, a positive supply voltage.

During a sampling phase of the SAR ADC 100, the input sampling switches 105a and 105b can connect a first input voltage and a second input voltage to the bottom plates 115a and the bottom plates 115b, respectively. The first input voltage and the second voltage can be in a range between a first reference voltage and a second reference voltage, respectively. The top plate sampling switches 135a and 135b can connect a top plate common mode voltage to the top plates 120a and top plates 120b, respectively.

Figure 1B:
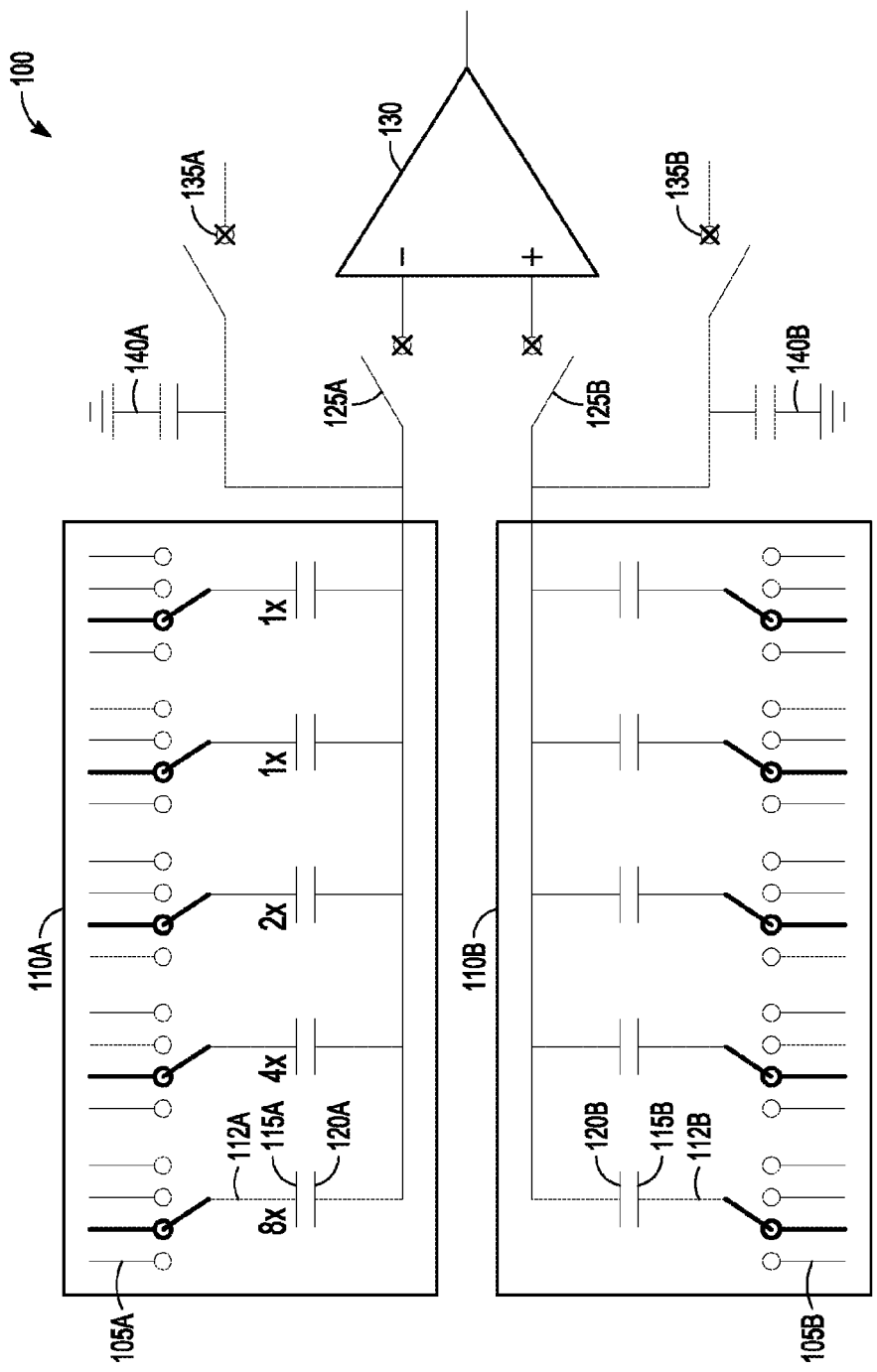
Figure 4A:
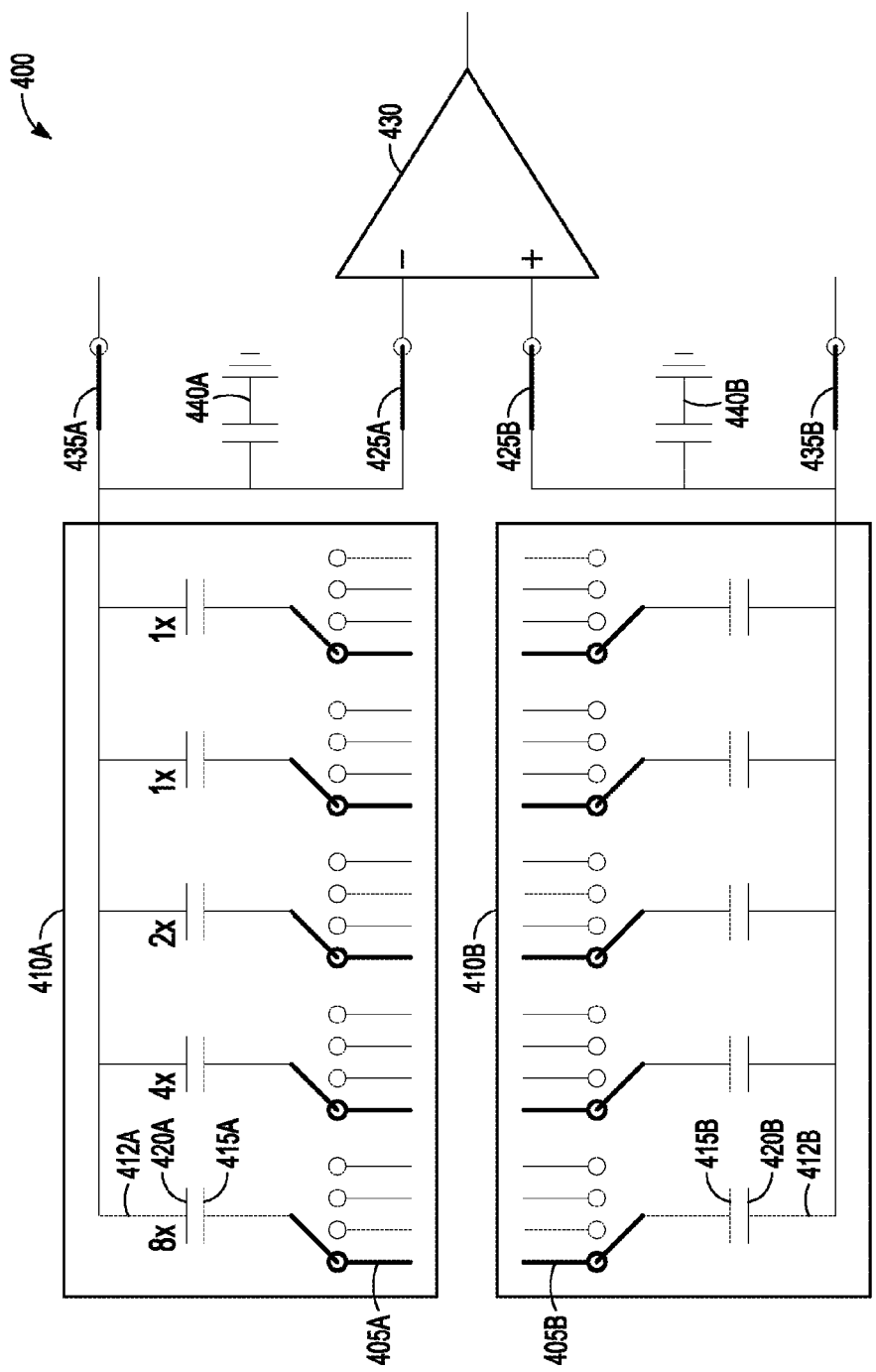
FIGS. 4A and 4B illustrate a diagram of a SAR ADC.
Figure 4B:
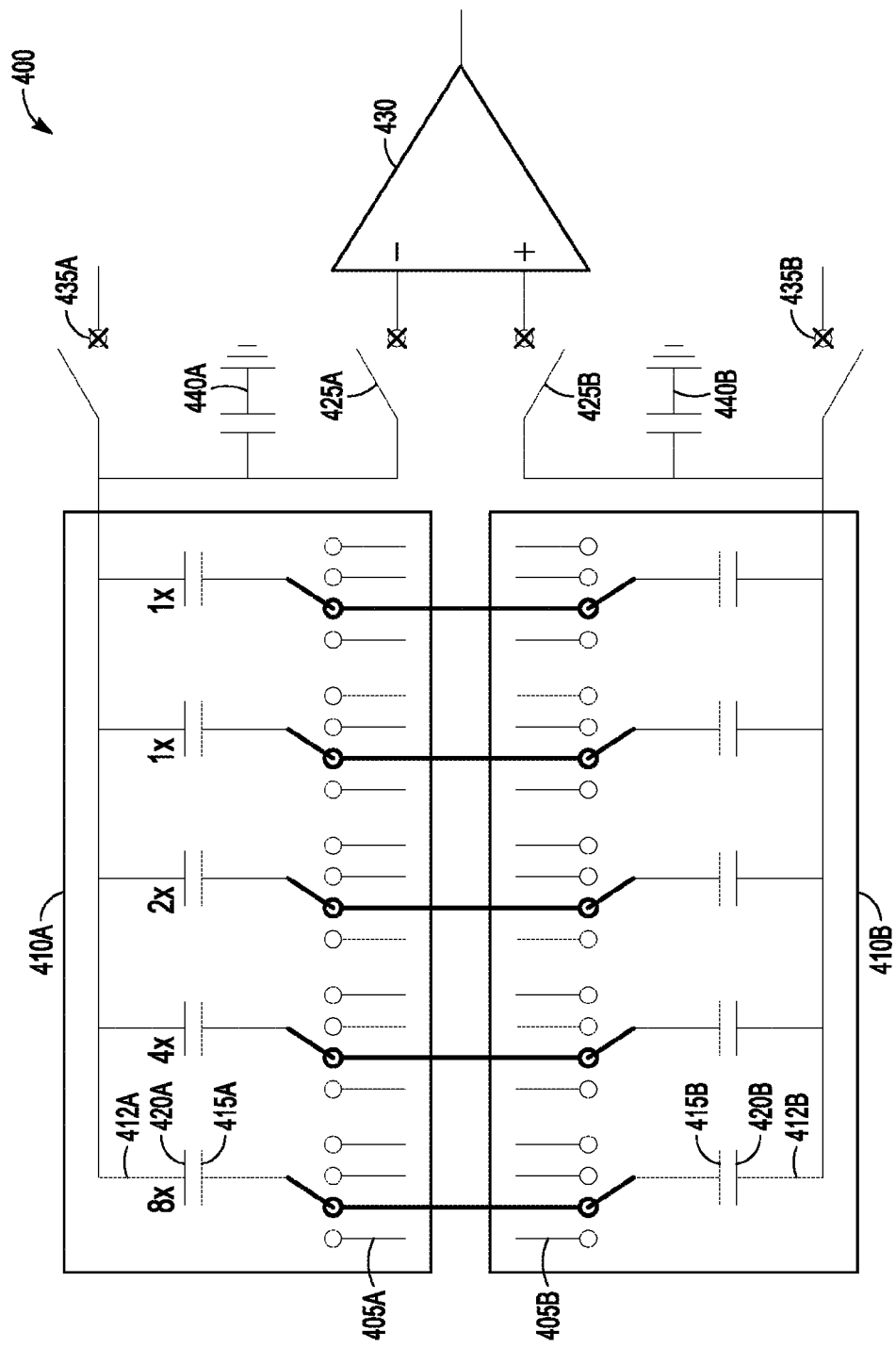

During a hold phase of the SAR ADC 100 as shown in FIG. 1B, the input sampling switches 105a and 105b can disconnect the first input voltage and the second input voltage from the bottom plates 115a and 115b, respectively. The top plate sampling switches 135a and 135b can disconnect the top plate common mode voltage from the top plates 120a and 120b, respectively. The comparator input switches 125a and 125b can be opened, such as to disconnect the comparator inputs from the top plates 115a and 115b, respectively. The input sampling switches 105a and 105b can then connect the bottom plates 115a and 115b to a common mode compensation voltage, respectively. The common mode compensation voltage can be selected such that the top plate voltages do not exceed the voltages allowed by the comparator inputs. In an example, the common mode compensation voltage can be selected such that the top plate voltages do not exceed a supply voltage by more than one diode drop (e.g., approximately 0.3V for a germanium diode or approximately 0.7V for a silicon diode). The common mode compensation voltage can selected, such as to be in the following range:

$$V_{in\_min}+(V_{dd}-V_{tcm})*(1+C_p/C_s) \geq V_{cmc} \geq V_{in\_max}-V_{tcm}*(+C_p/C_s)$$

where $V_{cmc}$ can represent the common mode compensation voltage, $V_{in\_min}$ can represent the minimum input voltage and $V_{in\_max}$ can represent the maximum input voltage at the bottom plates 115a and 115b, such as during a sampling phase of the SAR ADC 200, $V_{dd}$ can be a power supply voltage, $V_{tcm}$ can represent a top plate common mode voltage at the top plates 120a and 120b, such as during a sampling phase of the SAR ADC 200, $C_p$ can represent a parasitic capacitance 140a or 140b, and $C_s$ can represent the sum of the capacitance of capacitors 112a or 112b. In an example in which $V_{in\_max}=V_{refp}=V_{dd}$, and $V_{in\_min}=V_{refn}=0$, the common mode compensation voltage can be in the following range:

$$(V_{refp}-V_{tcm})*(1+C_p/C_s) \geq V_{cmc} \geq V_{refp}-V_{tcm}*(1+C_p/C_s)$$

where $V_{refp}$ can represent a first input reference voltage and $V_{refn}$ can represent a second input reference voltage, where $V_{refp} \geq V_{refn}$. In an example in which $C_p/C_s \approx 0$, the common mode compensation voltage can be $V_{cmc}=V_{refp}-V_{tcm}$. In an example, in which the average of the first input voltage and the second input voltage is equal to $V_{refp}/2$, the common mode compensation voltage can be $V_{cmc}=2*V_{incm}-V_{tcm}$, where $V_{incm}$ can be the average of the first input voltage and the second input voltage. In an example, the common mode compensation voltage can be applied to shorted bottom plates such as bottom plates 415a and 415b as shown in FIG. 4B. During a conversion phase, the comparator input switches 125a and 125b can be closed, and bit trials can be carried out by the SAR ADC 100.

Bit trials can be carried out after the sampling phase and the hold phase. After the sampling phase and the hold phase, the comparator input switches 125a and 125b can be closed, such as to connect the comparator inputs to the top plates 120a and 120b, respectively. The comparator 130 can then make a comparison, such as between a voltage at the top plates 120a of the first DAC 110a and a voltage at the top plates 120b of the second DAC 110b, and based on the comparison, a bit decision can be loaded onto the bottom plates 115a and 115b of the capacitors 112a and 112b corresponding to a digital bit. The bit decision can be loaded by closing switches 105a and 105b, such as to connect to a voltage that can correspond to a digital high or a digital low (e.g., a digital high can correspond to 5 volts and a digital low can correspond to 0 volts). Bit trials can be carried out until bit decisions have been loaded onto each pair of bottom plates 115a and 115b corresponding to a digital bit position. As the bit decisions are loaded, the common mode compensation voltage can be gradually disconnected from the bottom plates 115a and 115b, bit by bit, and the common mode voltage at comparator inputs can gradually approach the sampled top plate common mode voltage.

In an example, during a sampling phase such as shown in FIG. 1A, a 4V signal can be applied to the bottom plates 115a of the first DAC 110a, a 1V signal can be applied to the bottom plates 115b of the second DAC 110b, and a top plate common mode voltage of 0.9V can be applied to the top plates 120a of the first DAC 110a and the top plates 120b of the second DAC 110b. In such an example, during the hold phase as shown in FIG. 1B, the top plates 120a of the first DAC 110a and the top plates 120b of the second DAC 110b can be disconnected from the top plate common mode voltage of 0.9V. The input sampling switches 105a can be opened to disconnect the 4V signal and the 1V signal from the bottom plates 120a and 120b of the first and second DACs 110a and 110b, respectively. In the example, a common mode compensation voltage of 4.1V can be applied to the bottom plates 115a and 115b of the first and second DACs 110a and 110b, respectively. After applying the common mode compensation voltage, the voltage at the top plates 115a of the first DAC 110a can be 1V and the voltage at the bottom plates 115b of the second DAC 110b is 4V, both of which can be within the limits of the comparator inputs, which can be in the range of 0V to 5V, in this example.

Figure 2A:
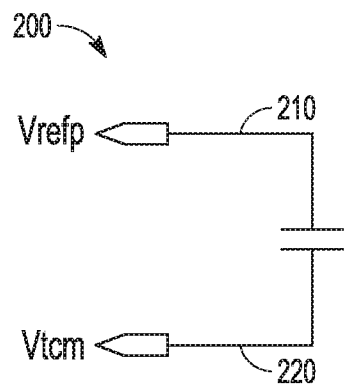
FIGS. 2A and 2B illustrate a capacitor configured to deliver a common mode compensation voltage.
Figure 2B:
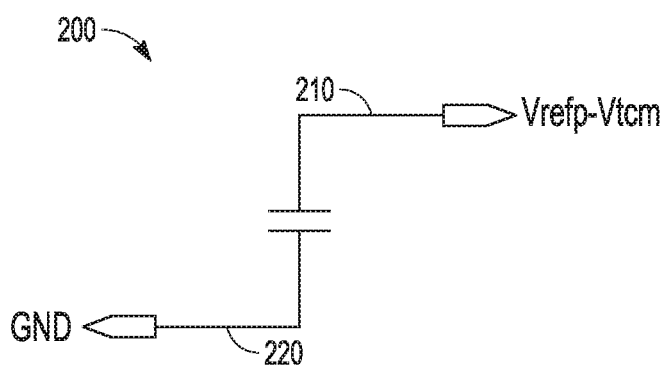

FIGS. 2A and 2B show an example of a common mode compensation capacitor such as a capacitor 200 having a top node 210 and a bottom node 220. The top node 210 can be connected to a first voltage during a sampling phase, and the bottom node 220 can be connected to a second voltage during a sampling phase. During a hold phase, the top node 210 can be connected to the bottom plates 115a and 115b and the bottom node 220 can be connected to ground, such as to provide a voltage to the bottom plates 115a and 115b equal to the difference between the first voltage and the second voltage. In an example, during a sampling phase, the top node 210 can be connected to $V_{refp}$ and the bottom node 220 can be connected to $V_{tcm}$. In such an example, prior to carrying out bit trials, the bottom node 220 can be connected to an electrical ground and the upper node 210 can be connected to the bottom plates 115a and 115b, such as to deliver a voltage equal to $V_{refp}-V_{tcm}$. In such an example where the capacitor 200 can provide a voltage to the bottom plates 115a and 115b, the capacitor 200 can provide a voltage that changes, such as in response to changes in $V_{refp}$ or $V_{tcm}$. In an example, the capacitor 200 can have a value that is greater than or equal to a capacitance of the parasitic capacitances 140a and 140b. In an example, the capacitor 300 can have a value approximately equal to a capacitance of the parasitic capacitances 140a and 140b (e.g., the capacitor 200 can have a capacitance that is within 50% of the capacitance of the parasitic capacitances 140a and 140b). In an example, the upper node 210 of the capacitor 200 can be connected to shorted bottom plates such as bottom plates 415a and 415b as shown in FIG. 4B.

Figure 3:
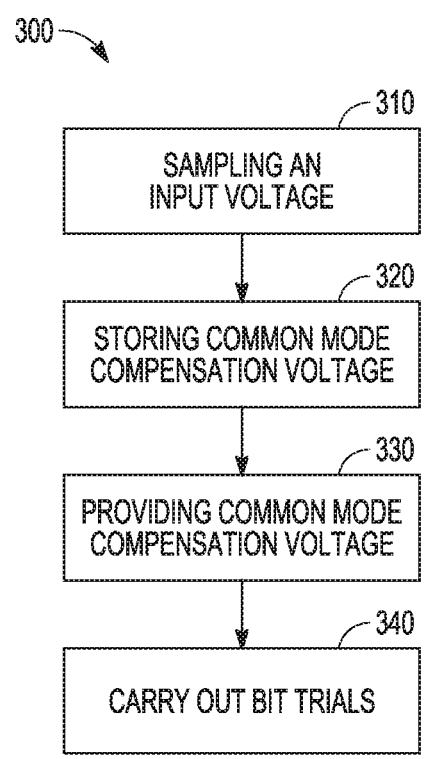
FIG. 3 illustrates a method of operation of a SAR ADC.

FIG. 3 shows an example of a method of providing a common mode compensation voltage in a SAR ADC 100. The SAR ADC 100 can sample an input voltage, for example by connecting a first input voltage and a second input voltage to the bottom plates 115a and 115b, respectively (step 310). A capacitor 200 can store a common mode compensation voltage (step 320). For example, the top node 210 of the capacitor 200 can be connected to a first voltage, and the bottom node 220 of the capacitor 200 can be connected to a second voltage. The capacitor 200 can then be configured to provide a common mode compensation voltage to the bottom plates 115a and 115b of the SAR ADC 100 (step 330). For example, the top node 210 of the capacitor can be connected to the bottom plates 115a and 115b of the SAR ADC 100 and the bottom node 220 of the capacitor can be connected to ground. The SAR ADC 100 can then carry out bit trials to convert the sampled analog input voltage into a digital output (step 340).

Described below is a method for providing a common mode voltage to the bottom plates of the DACs in a SAR ADC, such as which does not require an explicit voltage source or an extra pin (e.g., VCM) to begin SAR ADC bit trials. FIG. 4A shows an example of a SAR ADC 400. The SAR ADC 400 can include a first DAC 410a, a second DAC 410b, input sampling switches 405a and 405b, comparator input switches 425a, and 425b, comparator 430, and top plate sampling switches 435a and 435b. The first DAC 410a can include one or more capacitors 412a, and each capacitor 412a can include a top plate 420a and a bottom plate 415a. The capacitors 112a can include one or more parasitic capacitances 440a. The second DAC 410b can include multiple capacitors 412b, and each capacitor 412b can include a top plate 420b and a bottom plate 415b. The capacitors 112b can include one or more parasitic capacitances 440b. The bottom plates 415a and 415b can be connected to the input sampling switches 405a and 405b, respectively. The top plates 420a and 420b can be connected to the top plate sampling switches 435a and 435b, respectively. In an example, the top plates 420a and 420b can be connected to the comparator via comparator input switches 425a and 425b, respectively. In some examples, the top plates 420a and 420b can be directly connected to the comparator, such as without comparator input switches 425a and 425b. The inputs of the comparator 430 can accept voltages in a range between a zero volts and $V_{dd}$, a positive supply voltage.

During a sampling phase of the SAR ADC 400, the input sampling switches 405a and 405b can connect a first input voltage and a second input voltage to the bottom plates 415a and the bottom plates 415b, respectively, such as to sample the first and second input voltages, respectively. The first input voltage and the second voltage can be in a range between a first reference voltage and a second reference voltage, respectively. The top plate sampling switches 435a and 435b can connect a top plate common mode voltage to the top plates 420a and top plates 420b, respectively.

During a hold phase of the SAR ADC 400 as shown in FIG. 4B, the input sampling switches 405a and 405b can disconnect the first input voltage and the second input voltage from the bottom plates 415a and 415b, respectively. The top plate sampling switches 435a and 435b can disconnect the top plate common mode voltage from the top plates 420a and 420b, respectively. In examples that include comparator input switches 425a and 425b, the comparator input switches 425a and 425b can be opened, such as to disconnect the comparator inputs from the top plates 420a and 420b, respectively. The switches 405a and 405b can be closed, such as to connect the capacitors 412a and 412b, (e.g., connecting capacitors in the first DAC 410a with capacitors in the second DAC 410b that have corresponding digital bit positions) such as to provide a common mode voltage to the bottom plates 415a and 415b, respectively. For example, the voltage at the bottom plates 415a and 415b after closing the switches 405a and 405b, respectively, can be an average of the first sampled input voltage and the second sampled input voltage. The bottom plates 415a and 415b can be floating after closing switches 405a and 405b, such as to provide a connection between the capacitors 412a and 412b. Providing a common mode voltage such as by closing the switches 405a and 405b can eliminate the need for a buffered common mode voltage source. Eliminating the need for a buffered common mode voltage source, such as by the closing of the switches 405a and 405b can reduce the energy consumed by the SAR ADC. Eliminating the need for a buffered common mode voltage source, such as by the closing of the switches 405a and 405b can reduce electrical noise such as that which can be introduced by a buffered common mode voltage source. Eliminating the need for a buffered common mode voltage source, such as by the closing of the switches 405a and 405b can reduce the number of switching elements in the SAR ADC, such as which can reduce an area or volume occupied by the SAR ADC. Eliminating the need for a buffered common mode voltage source, such as by the closing of the switches 405a and 405b can reduce the number of wire bond connections to the bottom plates 415a and 415b, such as which can reduce a settling time of the bottom plates 415a and 415b in response to an applied voltage (e.g., when loading bit decisions onto the bottom plates 415a and 415b). Instead of connecting the bottoms plates 415a and 415b to a voltage source, such as can be done in certain systems, the closing of the switches 405a and 405b, such as to connect the bottoms plates 415a and 415b can improve the speed of the SAR ADC when performing bit trials.

Bit trials can be carried out after the sampling phase and the hold phase. In examples that include comparator input switches 425a and 425b, after the sampling phase and the hold phase, the comparator input switches 425a and 425b can be closed, such as to connect the comparator inputs to the top plates 420a and 420b, respectively. In some examples, the top plates 420a and 420b are directly connected to the comparator input. The comparator 430 can then make a comparison, such as between a voltage at the top plates 420a of the first DAC 410a and a voltage at the top plates 420b of the second DAC 410b, and based on the comparison, a bit decision can be loaded onto the bottom plates 415a and 415b of the capacitors 412a and 412b corresponding to a digital bit. The bit decision can be loaded by closing switches 405a and 405b, such as to connect to a voltage that can correspond to a digital high or a digital low (e.g., a digital high can correspond to 5 volts and a digital low can correspond to 0 volts). Bit trials can be carried out until bit decisions have been loaded onto each pair of bottom plates 415a and 415b corresponding to a digital bit position. In an example, after bit trials have been carried out, every pair of bottom plates 415a and 415b can be connected to a voltage that corresponds to a digital high or a digital low.

In an example where the switches 405a and 405b can be closed, such as to provide a common mode voltage to the bottom plates 415a and 415b, respectively, the loading of a bit decision during bit trials can provide a reduced disturbance of the voltage on other bottom plates 415a and 415b, such as those not corresponding to the digital bit being loaded with the bit decision (e.g., a bit decision being loaded onto the bottom plates of an 8× capacitor as shown in FIG. 4B can avoid disturbing the voltage on the bottom plates of a 4×, 2×, or 1× capacitor as shown in FIG. 4B).

In an example, during a sampling phase as shown in FIG. 4A, a 4V signal can be applied to the bottom plates 415a of the first DAC 410a, a 1V signal can be applied to the bottom plates 415b of the second DAC 410b, and a top plate common mode voltage of 2.5V can be applied to the top plates 420a of the first DAC 410a and the top plates 420b of the second DAC 410b. In such an example, during the hold phase as shown in FIG. 4B, the top plates 420a of the first DAC 410a and the top plates 420b of the second DAC 410b can be disconnected from the top plate common mode voltage of 2.5V. The input sampling switches 405a can be opened to disconnect the 4V signal and the 1V signal from the bottom plates 420a and 420b of the first and second DACs 410a and 410b, respectively. In the example, the switches 405a and 405b can then be closed, such as to connect the capacitors 412a and 412b, (e.g., connecting capacitors in the first DAC 410a with capacitors in the second DAC 410b that have corresponding digital bit positions) such as to provide a common mode voltage of 2.5V to the bottom plates 415a and 415b, respectively. The bottom plates 415a and 415b can be floating after closing switches 405a and 405b, such as to provide a connection between the capacitors 412a and 412b. After applying the common mode voltage, the voltage at the top plates 415a of the first DAC 410a can be 1V and the voltage at the bottom plates 415b of the second DAC 410b is 4 volts, both within the limits of the comparator inputs, which can be in the range of 0V to 5V.

Figure 5:
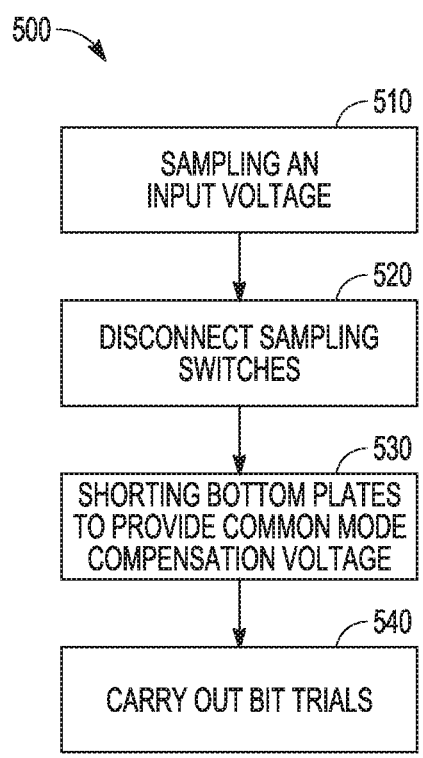
FIG. 5 illustrates a method of operation of a SAR ADC.

FIG. 5 shows an example of a method of providing a common mode voltage in a SAR ADC 400. The SAR ADC 400 can sample an input voltage, for example by connecting a first input voltage and a second input voltage to the bottom plates 415a and 415b, respectively (step 510). The input sampling switches 405a and 405 can then be opened to disconnect the bottom plates 415a and 415b from the first and second input voltages (step 520). The switches 405a and 405b can then be closed, such as to connect the capacitors 412a and 412b, (e.g., connecting capacitors in the first DAC 410a with capacitors in the second DAC 410b that have corresponding digital bit positions) such as to provide a common mode voltage to the bottom plates 415a and 415b, respectively (step 530). For example, the voltage at the bottom plates 415a and 415b after closing the switches 405a and 405b, respectively, can be an average of the first sampled input voltage and the second sampled input voltage. The bottom plates 415a and 415b can be floating after closing switches 405a and 405b, such as to provide a connection between the capacitors 412a and 412b. The bottom plates 415a and 415b can be floating after closing switches 405a and 405b, such as to provide a connection between the capacitors 412a and 412b. The SAR ADC 100 can then carry out bit trials to convert the sampled analog input voltage into a digital output (step 540).

The invention claimed is:

1. A method of establishing a common mode compensation voltage in a differential successive approximation register (SAR) converter, the method comprising:
sampling a first and second input voltage with respect to a top plate common mode voltage, respectively using a first and second digital-to-analog converter (DAC), the first and second DACs each having multiple capacitor elements, each element having a top plate and bottom plate and corresponding to a digital bit position;
preparing for carrying out bit trials by coupling the bottom plates of at least one pair of like digital bit position elements in the respective first and second DACs to a common mode compensation voltage that is based on a difference between an input reference voltage and a top plate common mode voltage or a difference between an input common mode voltage and a top plate common mode voltage; and
carrying out the bit trials using the first and second DACs.

2. The method of claim 1 wherein the common mode compensation voltage is based on a difference between an input reference Voltage and a top plate common mode voltage.

3. The method of claim 1 wherein the common mode compensation voltage is based on a difference between an input common mode voltage and a top plate common mode voltage.

4. The method of claim 1 comprising sampling the common mode compensation voltage onto a capacitor and coupling the capacitor to the bottom plate of the first and second DACs to provide the common mode compensation voltage to the first and second DACs.

5. The method of claim 1 further comprising disconnecting a comparator input from the first and second DAC before the preparing for carrying out bit trials.

6. The method of claim 5 further comprising reconnecting a comparator input to the first and second DAC after the preparing for carrying out bit trials, but before the carrying out the bit trials.

7. A system for establishing a common mode compensation voltage in a differential successive approximation register (SAR) converter, the system comprising:
a first digital-to-analog converter (DAC) circuit configured to sample a first input voltage with respect to a top plate common mode voltage, the first DAC circuit having multiple capacitor elements, each element having a top plate and bottom plate and corresponding to a digital bit position;
a second DAC circuit configured to sample a second input voltage with respect to the top plate common mode voltage, the second DAC circuit having multiple elements, each element having a top plate and bottom plate and corresponding to a digital bit position;
control circuitry configured to couple the bottom plates of at least one pair of like digital bit position elements in the respective first DAC circuit and the second DAC circuit to a common mode compensation voltage that is based on a difference between an input reference voltage and the top plate common mode voltage or a difference between an input common mode voltage and the top plate common mode voltage before carrying out bit trials; and
wherein the control circuitry is further configured to carry out bit trials using the first and second DAC circuits.

8. The system of claim 7 wherein the common mode compensation voltage is based on a difference between an input common mode voltage and a top plate common mode voltage.

9. The system of claim 7 wherein the common mode compensation voltage is based on a difference between an input reference voltage and a top plate common mode voltage.

10. The system of claim 7 comprising a capacitor configured to sample a common mode compensation voltage and to provide the sampled common mode compensation voltage to the first DAC circuit and the second DAC circuit.

11. The system of claim 7 wherein the control circuitry is further configured to disconnect a comparator input from the first and second DAC circuits before coupling the bottom plates of the first and second DAC circuits to the common mode compensation voltage.

12. The system of claim 11 wherein the control circuitry is further configured to reconnect the comparator input to the first and second DAC circuits, after coupling the bottom plates of the first and second DAC circuits to the common mode compensation voltage, but before carrying out the bit trials.

13. A method of establishing a common mode voltage in a differential successive approximation register (SAR) converter, the method comprising:
sampling a first and second input voltage with respect to a top plate common mode voltage, respectively using a first and second digital-to-analog converter (DAC), the first and second DACs each having multiple capacitor elements, each element having a top plate and bottom plate and corresponding to a digital bit position;
preparing for carrying out bit trials by forming an electrical connection from the bottom plate of at least one element in the first DAC to the bottom plate in at least one corresponding digital bit position element in the second DAC, to form at least one corresponding common mode voltage having a value of an average of the first and second input voltage; and then carrying out bit trials using the first and second DAC.

14. The method of claim 13 comprising:

before the preparing for carrying out bit trials, disconnecting a comparator input from the first and second DAC.

15. The method of claim 14 further comprising then reconnecting the comparator input to the first and second DAC and carrying out bit trials.

16. The method of claim 14 wherein the electrical connection formed by the bottom plate of at least one element in the first DAC and the bottom plate in at least one corresponding digital bit position element in the second DAC is floating.

17. A system for establishing a common mode voltage in a differential successive approximation register (SAR) converter, the system comprising:

a first digital-to-analog converter (DAC) circuit configured to sample a first input voltage with respect to a top plate common mode voltage, the first DAC circuit having multiple capacitor elements, each element including a top plate and a bottom plate and corresponding to a digital bit position;

a second DAC circuit configured to sample a second input voltage with respect to the top plate common mode voltage, the second DAC circuit having multiple elements, each element including a top plate and a bottom plate corresponding to a digital bit position;

control circuitry configured to form an electrical connection from the bottom plate of at least one element in the first DAC circuit to the bottom plate in at least one corresponding digital bit position element in the second DAC circuit before carrying out bit trials, to form at least one corresponding common mode voltage having a value of an average of the first and second input voltage; and wherein the control circuitry is further configured to carry out bit trials using the first and second DAC circuit.

18. The system of claim 17 wherein the control circuitry is further configured to disconnect a comparator input from the first DAC circuit and the second DAC circuit before forming the electrical connection between the first DAC circuit and the second DAC circuit.

19. The system of claim 18 wherein the control circuitry is further configured to then reconnect the comparator input to the first DAC circuit and the second DAC circuit, before carrying out bit trials.

20. The system of claim 18 wherein the electrical connection formed by the bottom plate of at least one element in the first DAC circuit and the bottom plate in at least one corresponding digital bit position element in the second DAC circuit is floating.

* * * * *